United States Patent [19]

Winston, Jr.

[11] Patent Number: 5,024,535

[45] Date of Patent: Jun. 18, 1991

[54] SEMICONDUCTOR LIGHT SOURCE TEMPERATURE MEASUREMENT

[75] Inventor: Charles R. Winston, Jr., North Canton, Conn.

[73] Assignee: United Technologies Corporation, Hartford, Conn.

[21] Appl. No.: 453,538

[22] Filed: Dec. 20, 1989

[51] Int. Cl.$^5$ .................... G01K 01/14; G01K 07/00
[52] U.S. Cl. .................... 374/178; 307/310; 372/34
[58] Field of Search .................... 374/178, 163; 372/34, 372/36

[56] References Cited

U.S. PATENT DOCUMENTS

| | | |
|---|---|---|
| 3,973,852 | 8/1976 | Moore et al. ............... 372/34 X |
| 3,996,451 | 12/1976 | Harrington et al. . |
| 4,123,938 | 11/1978 | Hamilton . |
| 4,215,577 | 8/1980 | Griffing et al. . |
| 4,243,898 | 1/1981 | Seelbach ............... 307/310 |
| 4,338,577 | 7/1982 | Sato et al. ............... 372/29 |
| 4,484,331 | 11/1984 | Miller ............... 372/38 |
| 4,536,851 | 8/1985 | Germanton et al. . |
| 4,604,753 | 8/1986 | Sawai ............... 372/36 |
| 4,636,092 | 1/1987 | Hegyl ............... 374/178 |
| 4,768,170 | 8/1988 | Hoff ............... 365/212 |
| 4,808,009 | 2/1989 | Sittler et al. ............... 374/178 |

Primary Examiner—Daniel M. Yasich
Attorney, Agent, or Firm—Ronald R. Snider

[57] ABSTRACT

A temperature sensing semiconductor device is fabricated in the same substrate as a semiconductor light source. A sensing voltage generated across the sensing device is proportional to light source temperature. The sensing voltage is amplified by an operational amplifier, and converted into a digital signal by an analog to digital converter. A microprocessor converts the digital signal into a corresponding temperature signal using a look-up table.

11 Claims, 5 Drawing Sheets

SEMICONDUCTOR LIGHT SOURCE TEMPERATURE MEASUREMENT

DESCRIPTION

1. Technical Field

This invention relates to temperature sensing devices and more particularly to temperature sensing devices for measuring semiconductor light source temperature.

2. Background Art

A fiber optic gyroscope (FOG) includes a source of light energy, e.g., a laser diode semiconductor light source, which provides coherent light split into two substantially equal beams by a beamsplitter. The beamsplitter is coupled to the ends of a length of optical fiber wound in a coil of one or more turns. The light beams are launched into each end of the coil, and when no rotational disturbances are present, the beams propagate equally in opposite directions around the coil and recombine to form a fringe pattern at a detector.

When the coil is subject to a rotation about an axis normal to the coil, a nonreciprocal disturbance occurs, known as the Sagnac effect, whereby the opposing light beams take different times to traverse the coil, thereby causing a difference in phase between the beams when they reach the detector. The difference in phase between the beams shifts the fringe pattern at the detector. The magnitude and direction of the fringe shift is proportional, respectively, to the rate and sense of the rotation applied to the coil about its axis.

A phase difference between the two light beams in the coil can be compensated for (i.e., nulled) by imposing a further nonreciprocal phase shift on the beams in an equal and opposite manner to the existing phase difference by using a phase modulator, e.g., a lithium niobate integrated optic phase modulator. In a serrodyne closed-loop FOG, a phase modulator is driven by a linear ramp or a step ramp signal to produce a phase shift in the light passing through the phase modulator, the phase shift being equal and opposite to the phase shift caused by the Sagnac effect. When the magnitude of the ramp is held constant, and the duration of flyback time (i.e., the time it takes for the ramp voltage to change from peak to reference voltage) is approximately zero, gyro rate information is given by the following relationship:

$$\Omega = (SF) * (f)$$

where $\Omega$ is the angular rate of gyro rotation, f is the frequency of the linear ramp, and SF is a scale factor. The ramp frequency can be directly measured, and the scale factor is a proportionality factor dependent upon the source wavelength.

The source wavelength is a function of the source temperature, e.g. 0.03%/° C .for a laser diode. Because of this relationship, it is important to know the temperature of the source so that either a scale factor correction can be made for changes in temperature, or the source temperature may be controlled to maintain a constant wavelength and scale factor.

Some known packaged semiconductor sources comprise a temperature control loop consisting of a thermistor mounted to a substrate or package surface for measuring source temperature, and a means to cool the source package, such as a thermo-electric cooler. The cooler attempts to maintain the source at a constant temperature, thereby removing temperature-induced wavelength variations.

However, the thermistor does not directly measure the source's temperature, which results in two types of error. A steady-state error occurs due to the thermal resistance between the thermistor and the source. This error may vary further with the source's efficiency, which can change due to aging. A second type of error is delayed response caused by thermal transport lag and the thermistor time constant. This error is most prevalent during system power up and source power transients.

In many FOG applications, desired warm up time may be given in terms of seconds; however, thermal stabilization times of the source and thermistor may actually be measured in minutes. This undesirably long warm-up time may seriously affect system accuracies in an otherwise high-accuracy gyro.

DISCLOSURE OF THE INVENTION

Objects of the present invention include provision of improved semiconductor light source temperature measurement which rapidly responds to changes in source temperature.

According to a first aspect of the present invention, a temperature sensing semiconductor device is fabricated in the same substrate as a semiconductor light source; an electrical current is passed through the sensing device and an electrical voltage developed across the device is sensed by a signal processor. In further accord with the invention, the voltage is converted into a temperature signal by the signal processor using a known temperature-voltage relationship of the sensing device. In still further accord with the invention, the voltage signal is amplified before it is sensed by the signal processor.

According to a second aspect of the present invention, an existing semiconductor light source fabricated on a semiconductor substrate has an electrical current passed therethrough and a resulting electrical voltage developed across the light source is sensed and converted into a temperature signal using a known temperature-voltage relationship of the semiconductor light source.

The present invention represents an advancement over previous semiconductor light source temperature measurement devices, such as a thermistor, because thermal resistance is greatly reduced between the light source and the temperature-sensitive semiconductor device fabricated in the same substrate. Therefore, steady state errors and transport lags due to thermal resistance are greatly reduced. Also, more accurate temperature information can be supplied to a temperature control loop to better maintain the source at a desired temperature. In addition, the required warm up time of the gyro is reduced because of the rapid response time to changes in source temperature.

A further advancement of the present invention is that the more accurate source temperature measurement can be used with the wavelength versus temperature characteristic of the light source to more accurately determine the wavelength of the light emitted by the light source. The wavelength determination can then be used to remove the wavelength sensitivity of devices employing the light source, e.g. a serrodyne closed-loop, fiber optic gyroscope.

The foregoing and other objects, features and advantages of the present invention will become more apparent in the light of the following detailed description of an exemplary embodiment thereof, as illustrated in the accompanying drawings.

BEST MODE FOR CARRYING OUT THE INVENTION

Figure 1:
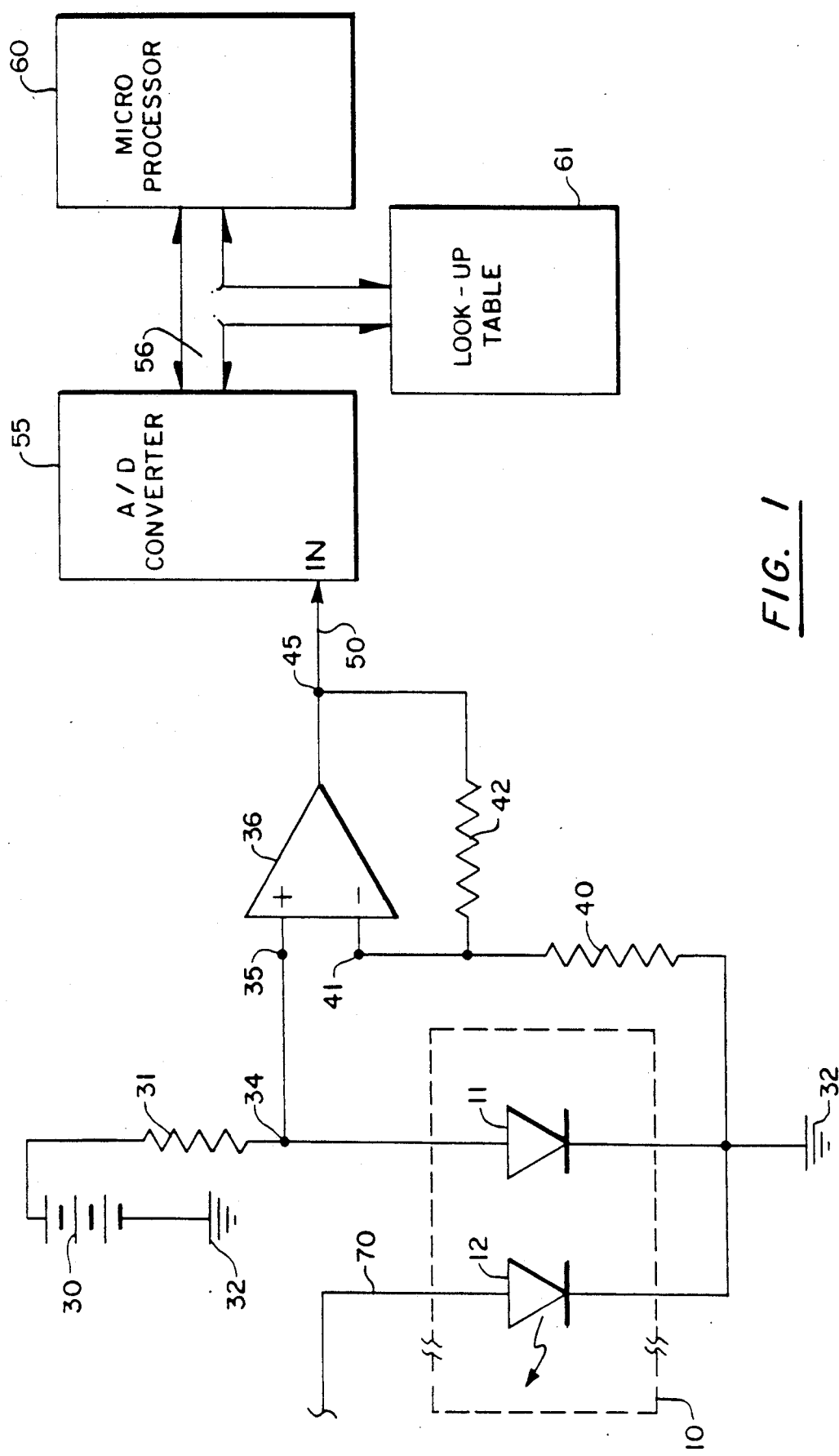
FIG. 1 is a schematic diagram of a semiconductor temperature sensing device of the present invention in a temperature sensing circuit.

Referring to FIG. 1, a monolithic integrated circuit (IC) 10 comprises a temperature sensitive semiconductor device 11 such as a Gallium Arsenide (GaAs) diode, and a semiconductor light source 12, e.g., a GaAs laser diode. The sensing diode 11 and the laser diode 12 are fabricated onto the substrate of the IC 10 using known epitaxial-diffused fabrication processes for ICs described hereinafter.

Figure 2:
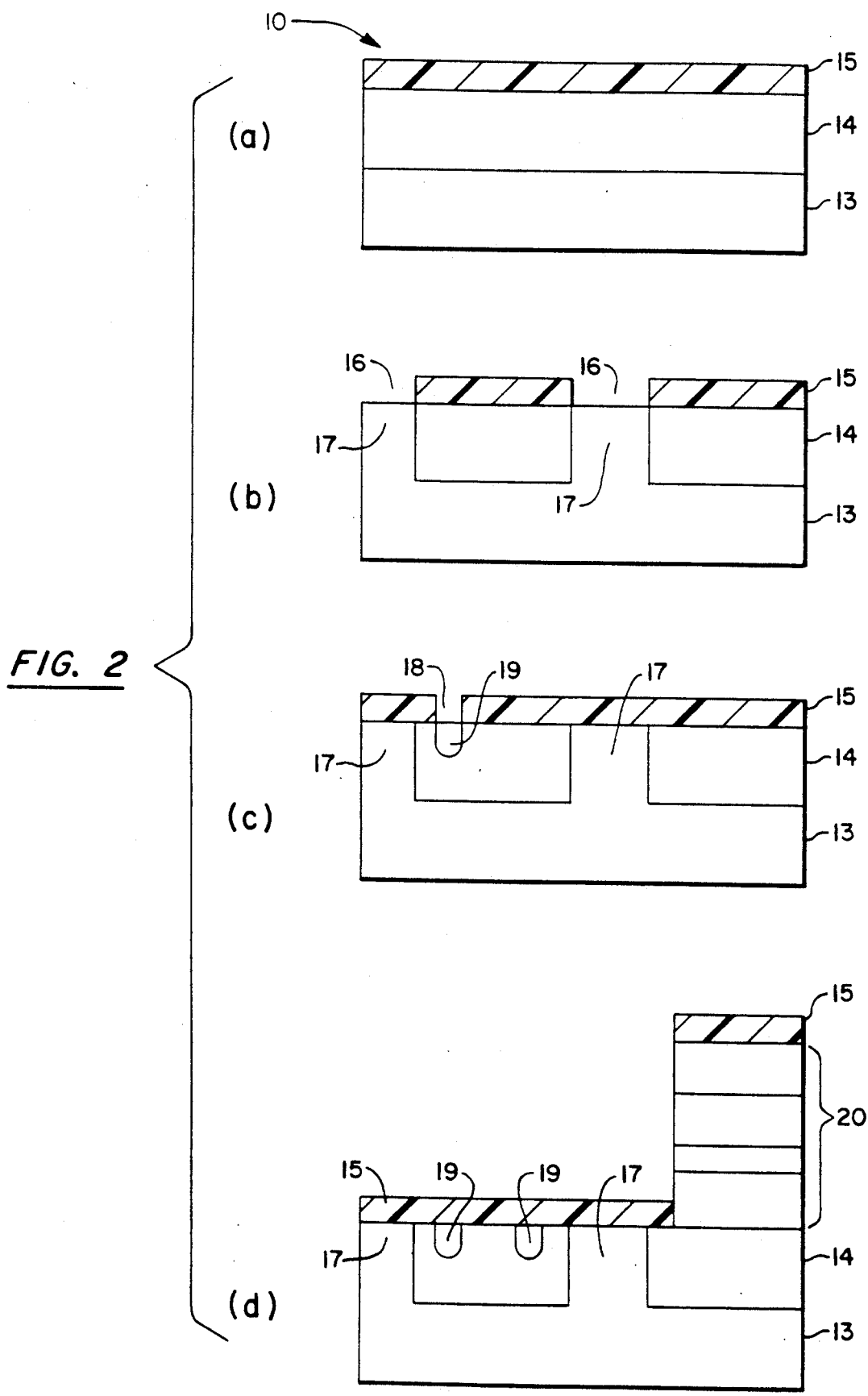
FIGS. 2(a)-(d) are schematic diagrams of an integrated circuit in various stages of an epitaxial-diffused fabrication process.

Referring to FIG. 2(a), the IC 10 is formed by first providing a thin layer of substrate material 13, e.g., GaAs doped with a high concentration of n-type donor atoms (i.e., atoms having excess free electrons), one side of the substrate layer 13 being lapped and polished. Next, an epitaxial growth process is used to grow a second layer 14 on the substrate 13. The epitaxial layer 14 will have a different type or concentration of impurity atoms, e.g., a lower concentration of n-type impurity atoms. During this process, the substrate 13 is exposed to a high temperature, gaseous environment; the gas containing the substrate crystal material having a different concentration or different type of impurity material. The crystal material in the gas is deposited on the polished side of the substrate. An oxide layer 15 is then formed on the epitaxial layer 14 by exposing the assembly to a high temperature oxygen or steam atmosphere.

Referring to FIG. 2(b), an etching and diffusion process is performed where sections 16 of the oxide layer 15 are first removed. Next, isolation diffusion takes place by exposing the assembly to an atmosphere containing the same impurities as the substrate impurities. The time and temperature of exposure is controlled to allow the impurities to penetrate the epitaxial layer and reach the substrate 13, thereby forming isolation regions 17 which allow electrical isolation between different circuit components.

A new oxide layer 15 is then formed and sections 18 of the layer are removed (FIG. 2(c)) so that circuit components 19 (e.g., the sensing diode 11 and the laser diode 12) can be formed in the assembly. Component formation is accomplished using the aforedescribed isolation diffusion process with a variety of diffusion atoms, such as n-type donor atoms or p-type acceptor atoms (i.e., atoms having excess free holes), to form the desired circuit components. This process is repeated as required to form the desired circuit components.

In addition to oxide layer formation and subsequent removal for isolation diffusion, sections of oxide layer may be removed for formation of additional epitaxial growth layers 20, as illustrated in FIG. 2(d).

Once the diffusion and epitaxial growth steps are complete, a new oxide layer 15 is formed, and sections of the layer are again removed for deposition of metal to form ohmic contacts 21 (FIG. 3) with the integrated circuit components formed in the assembly.

Figure 3:
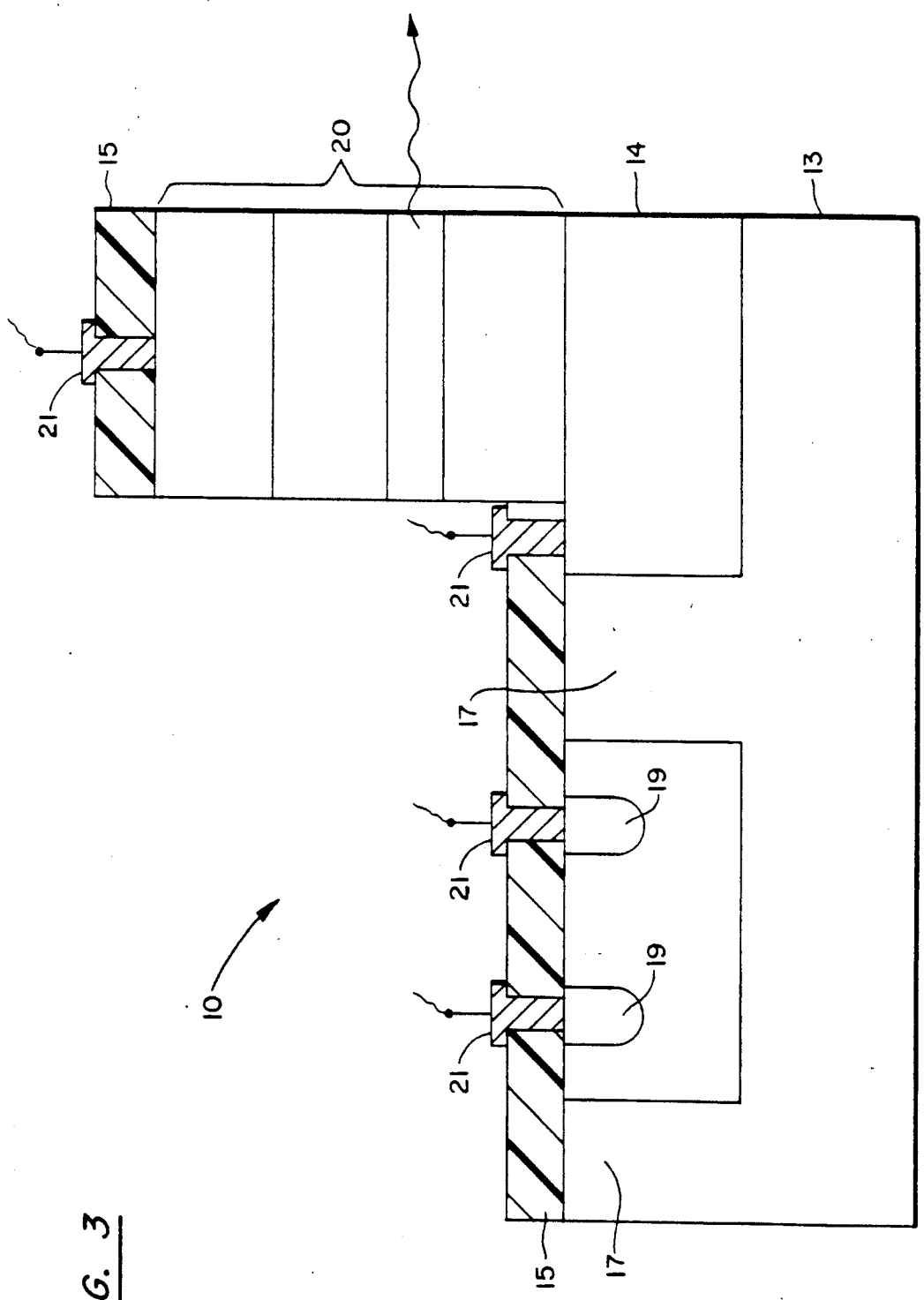
FIG. 3 is a schematic diagram of an integrated circuit containing the semiconductor temperature sensing device of FIG. 1.

Referring to FIG. 3, the epitaxial-diffused fabrication process may be used to fabricate the IC 10 of the present invention containing a GaAs diode 11 and a GaAs laser 12.

Referring again to FIG. 1, a DC power supply 30 supplies a junction current ($i_j$) to forward bias the sensing diode 11. The junction current flows from the supply 30 through a resistor 31 and the diode 11 to ground 32. The value of the resistor 31 connected between the supply and the diode 11 is selected so that the junction current ($i_j$) is greater than the sensing diode saturation current ($I_s$).

Figure 4:
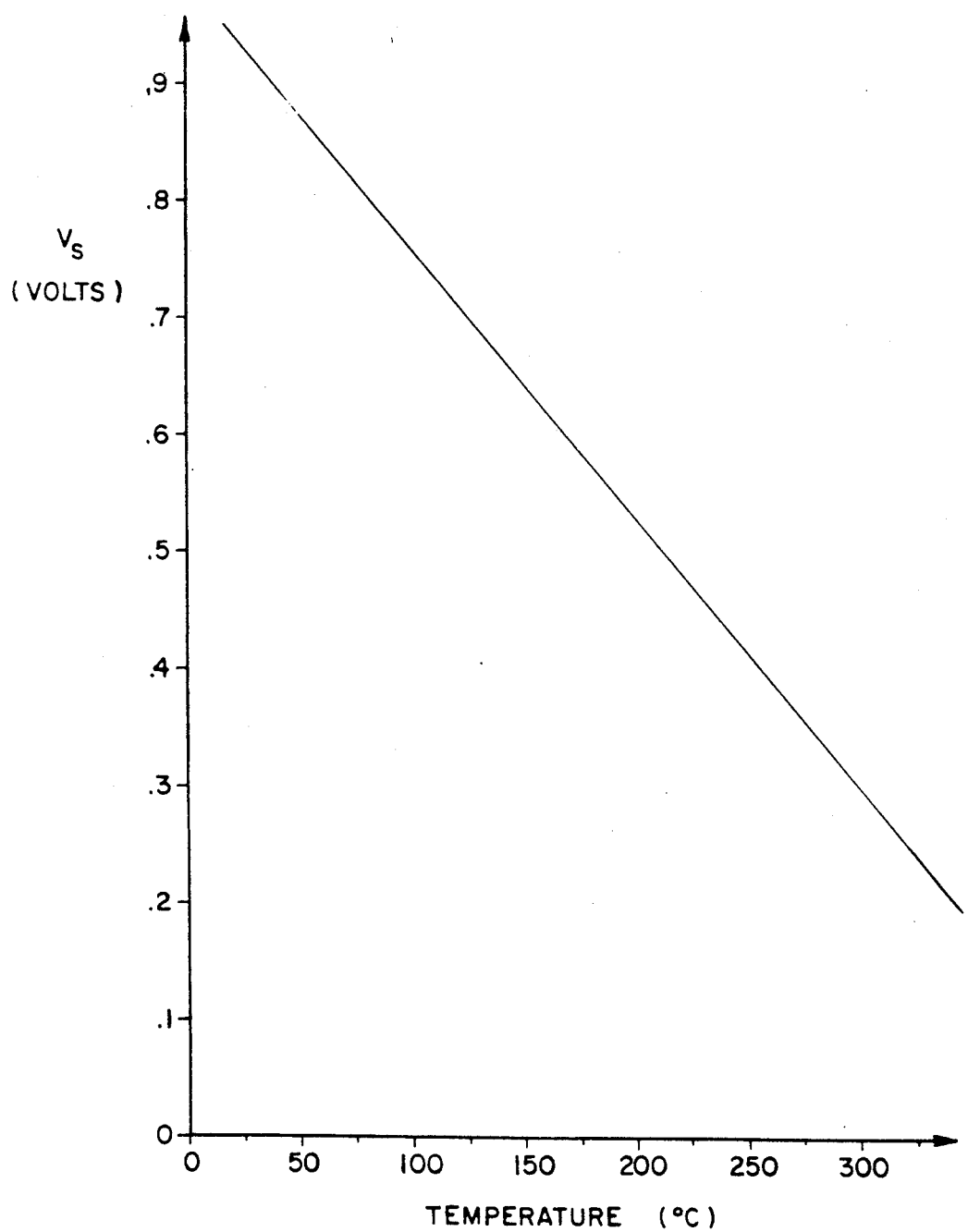
FIG. 4 is a graphical representation of the temperature versus voltage characteristic of the temperature sensing device of FIG. 1.

The sensing voltage ($V_s$) is the voltage across the sensing diode measured at the junction (node) 34 between the sensing diode 11 and the resistor 31, and is a function of junction current ($i_j$) and sensing diode temperature (T), as given by the following relationship:

$$V_2 = (kT/q)(ln(i_j/I_s)) \qquad \text{(Eq. 1)}$$

where k is Boltzmann's constant and q is the charge of an electron. FIG. 4 is a graphical representation of the voltage versus temperature relationship for a GaAs diode having a 10 micro-amp junction current. The relationship is approximately linear in the temperature range of 25° C. to 300° C., and is given by the following equation:

$$T = 434.65° \text{ C.} - (444.42° \text{ C./volt})(V_s) \qquad \text{(Eq. 2)}$$

A non-inverting terminal 35 of an operational amplifier 36 is connected to the node 34. A shunt resistor ($R_s$) 40 is connected between an inverting terminal 41 of the operational amplifier 36 and ground 32. A feedback resistor ($R_f$) 42 is connected between the inverting terminal 41 and an output terminal 45 of the operational amplifier 36.

The sensing voltage ($V_s$) is applied at the non-inverting terminal 35. An output voltage ($V_o$) generated at the output terminal 45 is a function of the sensing voltage, the shunt resistance and the feedback resistance as given in the following relationship:

$$V_o = V_s(1 + R_f/R_s) \qquad \text{(Eq. 3)}$$

The output voltage ($V_o$) is supplied on a line 50 to an analog to digital converter 55 (ADC). The ADC 55 converts the analog voltage signal on the line 50 into a corresponding digital signal. The output of the ADC 55 is supplied on signal lines 56 to a microprocessor 60 which converts the digital voltage signal into a corresponding temperature signal using a look-up table 61. The look-up table 61 comprises a plurality of memory locations for storing corresponding temperature signal information.

During operation, a bias current signal is supplied on a signal line 70 to energize the laser diode 12. The temperature of the laser diode 12 changes as it is operated, thereby changing the wavelength of the light emitted by the laser diode. The temperature of the substrate 13 changes in response to changes in the laser diode temperature. Also, since the laser diode and the sensing diode are on the same substrate, the thermal resistance between them is reduced. Thus, the temperature of the sensing diode is approximately equal to the temperature of the laser diode, while the sensing voltage ($V_s$) rapidly responds to changes in sensing diode temperature (T).

As described hereinbefore, the sensing voltage ($V_s$) is amplified by the operational amplifier 36, converted into a digital signal by the ADC 55, and then converted into a temperature signal by the microprocessor 60 using the look-up table 61. The temperature signal represents the temperature of the sensing diode 11, and because of the reduced thermal resistance between the sensing diode 11 and the laser diode 12, the temperature signal is approximately equal to laser diode temperature.

The temperature signal may, if desired, be used in a temperature control loop to maintain the laser diode at a desired temperature. In this case, the temperature signal may be output from the microprocessor to suitable control circuitry, or the microprocessor itself may be responsive to the temperature signal in controlling the laser diode temperature in a suitable way that should be apparent to one of ordinary skill in the art.

The rapid response of the sensing voltage to changes in temperature reduces warm-up time in instruments (e.g., FOG) employing a laser diode since errors in temperature measurement due to thermal lag are greatly reduced. In addition, the temperature signal may be further used in conjunction with a typical temperature versus wavelength characteristic of the laser diode 12 to determine the wavelength of the light emitted by the laser diode, thereby allowing a scale factor correction in a serrodyne closed-loop, fiber optic gyroscope.

Figure 5:
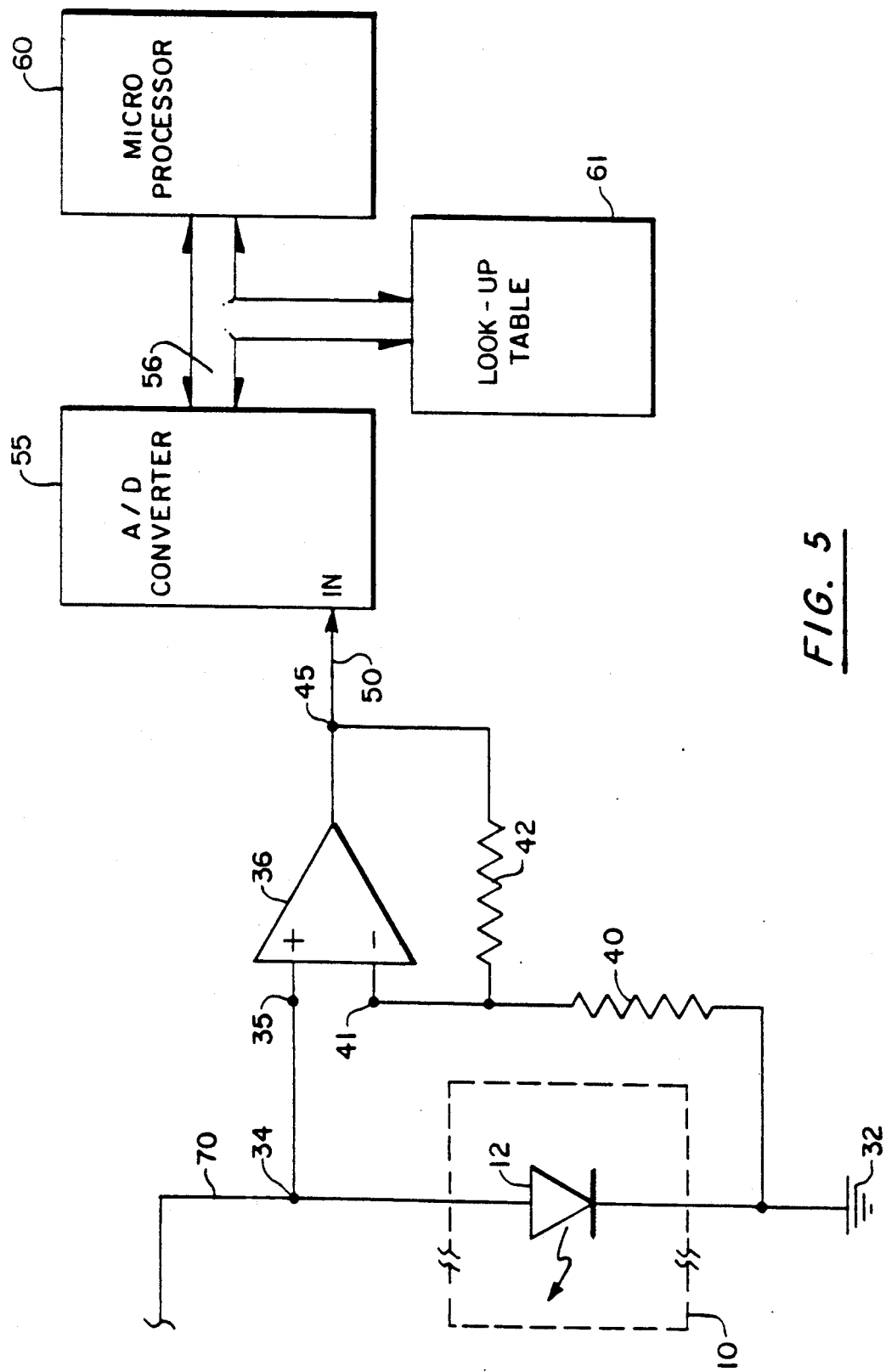
FIG. 5 is a schematic diagram of a semiconductor light source and a temperature sensing circuit in an alternative embodiment of the present invention.

As an alternative to the aforementioned preferred embodiment, the non-inverting input 35 of the operational amplifier 36 may be connected directly to the signal line 70, as illustrated in FIG. 5. In this alternative embodiment, there is no need to fabricate a temperature sensing diode on the IC 10. Instead, the voltage across the semiconductor light source 12 is present at the non-inverting input 35 of the operational amplifier 36 in the same manner as in the preferred embodiment where the voltage across the sensing diode 11 is present at the non-inverting input 35 of the operational amplifier 36 illustrated in FIG. 1. As the light source is operated by supplying a bias current signal on the line 70, the voltage at the node 34 is fed directly to the non-inverting input 35 of the operational amplifier 36. It is well known that a semiconductor light source has a voltage-temperature characteristic similar to the characteristic illustrated in FIG. 4, and therefore, the voltage across the light source present at the non-inverting input 35 of the operational amplifier 36 is amplified by the operational amplifier, converted into a digital signal by the ADC 55, and processed by the microprocessor 60 using the look up table 61 to develop the temperature signal indicative of the temperature of the light source 12.

However, a difference between this alternative embodiment and the preferred embodiment is that, in the preferred embodiment, the point of operation (bias point) of the temperature sensing diode 11 may be selected on the diode operating curve for maximum voltage measurement sensitivity. On the other hand, for the alternative embodiment, the point of operation of the semiconductor light source may not necessarily yield the maximum voltage measurement sensitivity.

Although the invention is illustrated as being implemented by a diode, other temperature sensitive semiconductor devices may be fabricated on the substrate without departing from the spirit or scope of the present invention. A zener diode, a semiconductor resistor, and the base-emitter or base-collector junction of a transistor are examples of semiconductor devices having a suitable temperature characteristic. Also, it is to be understood that the GaAs laser diode used as the semiconductor light source 12 is exemplary; other light sources may be used; e.g., a light emitting diode (LED), an edge-emitting diode (ELED), a super luminescent diode (SLD), or a distributed feedback (DFB) laser diode. Further, although the invention is illustrated as being used with an operational amplifier, other amplification devices may be used. However, it is to be understood that an amplification device is not required if the magnitude of the sensing voltage ($V_s$) is sufficient to be sensed by the A/D converter.

The microprocessor is described as converting the digital signal into a temperature signal using a look-up table. However, other signal conversion methods could be used such as a subroutine which performs a calculation using a relationship which defines the curve of the light source voltage versus temperature characteristic. In addition, although the integrated circuit 10 is described as being fabricated using the epitaxial-diffused fabrication process, other integrated circuit fabrication techniques could be employed; e.g., crystal growth techniques and alloy or fused construction.

Although the invention has been illustrated and described with respect to exemplary embodiments thereof, it should be understood by those skilled in the art that the foregoing and various other changes, omissions and additions may be made therein and thereto, without departing from the spirit and scope of the invention.

I claim:

1. Apparatus, comprising:
    a semiconductor substrate;
    a semiconductor light source, formed in said semiconductor substrate; and
    temperature sensing means, formed in said semiconductor substrate in proximity to said semiconductor light source, for providing an electrical signal indicative of an electrical voltage across said temperature sensing means, said electrical signal varying as a function of the temperature of said semiconductor substrate, whereby the temperature of said substrate varies as said light source is operated.

2. Apparatus according to claim 1, further comprising signal processing means for providing, in response to said electrical signal, a temperature signal indicative of the temperature of said semiconductor light source.

3. Apparatus according to claim 2, wherein said signal processing means comprises means for providing a digital signal in response to said electrical signal, and for providing said temperature signal in response to said digital signal.

4. Apparatus according to claim 3 further comprising amplifying means for amplifying said electrical signal.

5. Apparatus according to claim 2, wherein said signal processing means comprises means for providing, in response to said temperature signal, a wavelength signal indicative of the wavelength of said semiconductor light source.

6. Apparatus according to claim 1 wherein said temperature sensing means is a diode.

7. Apparatus according to claim 1 wherein said temperature sensing means is a zener diode.

8. Apparatus according to claim 1 wherein said temperature sensing means is a transistor base-emitter junction.

9. Apparatus according to claim 1 wherein said temperature sensing means is a transistor base-collector junction.

10. Apparatus according to claim 1 wherein said temperature sensing means is a semiconductor resistor.

11. A method of measuring the temperature of a semiconductor light source, comprising the steps of:

providing a semiconductor substrate;

forming the semiconductor light source in said semiconductor substrate;

forming a temperature sensing device in said semiconductor substrate in proximity to the light source;

injecting electrical current through said temperature sensing device;

measuring the voltage across said temperature sensing device; and determining the temperature of the light source as a function of said measured voltage across said temperature sensing device, whereby the temperature of the light source is approximately equal to the temperature of said temperature sensing device due said temperature sensing device being formed in proximity to the light source in said semiconductor substrate.

* * * * *

UNITED STATES PATENT AND TRADEMARK OFFICE
CERTIFICATE OF CORRECTION

PATENT NO. : 5,024,535

DATED : June 18, 1991

INVENTOR(S) : Charles R. Winston, Jr.

It is certified that error appears in the above-identified patent and that said Letters Patent is hereby corrected as shown below:

On the title page, before item [57] Abstract, please change the "Attorney, Agent, or Firm — Ronald R. Snider" to read as follows:

--Attorney, Agent, or Firm — Richard H. Kosakowski--.

Col. 4, line 27, "$V_2$" should read --$V_s$--.

Signed and Sealed this

Seventeenth Day of November, 1992

Attest:

DOUGLAS B. COMER

*Attesting Officer*     *Acting Commissioner of Patents and Trademarks*